(12) United States Patent
Hayashi et al.

(10) Patent No.: US 10,096,462 B2
(45) Date of Patent: Oct. 9, 2018

(54) SUBSTRATE PROCESSING METHOD AND STORAGE MEDIUM

(71) Applicants: Kabushiki Kaisha Toshiba, Tokyo (JP); Tokyo Electron Limited, Tokyo (JP)

(72) Inventors: Hidekazu Hayashi, Yokkaichi (JP); Yohei Sato, Yokkaichi (JP); Hisashi Okuchi, Yokkaichi (JP); Hiroshi Tomita, Yokohama (JP); Kazuyuki Mitsuoka, Nirasaki (JP); Gen You, Nirasaki (JP); Hiroki Ohno, Nirasaki (JP); Takehiko Orii, Nirasaki (JP); Takayuki Toshima, Koshi (JP)

(73) Assignees: Toshiba Memory Corporation, Minato-Ku (JP); Tokyo Electron Limited, Minato-Ku (JP)

( * ) Notice: Subject to any disclaimer, the term of this patent is extended or adjusted under 35 U.S.C. 154(b) by 1054 days.

(21) Appl. No.: 13/941,836

(22) Filed: Jul. 15, 2013

(65) Prior Publication Data

US 2014/0020721 A1    Jan. 23, 2014

(30) Foreign Application Priority Data

Jul. 18, 2012    (JP) ................ 2012-159850

(51) Int. Cl.
*H01L 21/02*    (2006.01)
*B08B 7/00*    (2006.01)
*H01L 21/67*    (2006.01)

(52) U.S. Cl.
CPC ...... *H01L 21/02101* (2013.01); *B08B 7/0021* (2013.01); *H01L 21/02041* (2013.01);
(Continued)

(58) Field of Classification Search
CPC ......... H01L 21/02041; H01L 21/02057; H01L 21/02101; H01L 21/67051; H01L 21/67109; B08B 7/0021
See application file for complete search history.

(56) References Cited

U.S. PATENT DOCUMENTS

| 6,067,728 A | 5/2000 | Farmer et al. |
| 6,508,259 B1 | 1/2003 | Tseronis et al. |

(Continued)

FOREIGN PATENT DOCUMENTS

| JP | 2010-161165 A1 | 7/2010 |
| JP | 2011-187570 A1 | 9/2011 |
| JP | 2012-109301 A1 | 6/2012 |

OTHER PUBLICATIONS

Japanese Office Action (Application No. 2012-159850) dated May 24, 2016 (with English translation).

*Primary Examiner* — Katelyn B Whatley
(74) *Attorney, Agent, or Firm* — Burr & Brown, PLLC

(57) ABSTRACT

A substrate processing method and apparatus for preventing evaporation of an anti-drying fluorine-containing organic solvent from a substrate during transportation of the substrate into a processing container and can prevent decomposition of a fluorine-containing organic solvent in the processing container. A substrate, the surface of which is covered with a first fluorine-containing organic solvent, is carried into a processing container. The first fluorine-containing organic solvent is removed from the substrate surface by forming a high-pressure fluid atmosphere of a mixture of the first fluorine-containing organic solvent and a second fluorine-containing organic solvent, having a lower boiling point than the first fluorine-containing organic solvent, in the processing container e.g. by supplying a high-pressure fluid of the second fluorine-containing organic solvent into the processing container. Thereafter, a fluid in (Continued)

the state of a high-pressure fluid or a gas is discharged from the processing container to obtain the substrate in the dried state.

7 Claims, 12 Drawing Sheets

(52) U.S. Cl.
CPC .. *H01L 21/02057* (2013.01); *H01L 21/67017* (2013.01); *H01L 21/67051* (2013.01); *H01L 21/67109* (2013.01)

(56) References Cited

U.S. PATENT DOCUMENTS

| | | | |
|---|---|---|---|
| 6,562,146 | B1 | 5/2003 | De Young et al. |
| 7,531,047 | B1 * | 5/2009 | Dryer .................... B41J 2/1603 |
| | | | 134/1.1 |
| 8,322,045 | B2 | 12/2012 | Stein et al. |
| 2007/0289611 | A1 * | 12/2007 | Hayashi ............ H01L 21/02052 |
| | | | 134/26 |
| 2010/0206337 | A1 * | 8/2010 | Hiroshiro .................. B08B 3/04 |
| | | | 134/26 |
| 2011/0000507 | A1 | 1/2011 | Toshima et al. |
| 2011/0214694 | A1 * | 9/2011 | Toshima ................... B08B 5/00 |
| | | | 134/21 |
| 2012/0118332 | A1 * | 5/2012 | Sato ................. H01L 21/67034 |
| | | | 134/30 |
| 2012/0304458 | A1 | 12/2012 | Yamauchi et al. |
| 2013/0000144 | A1 | 1/2013 | Choi et al. |
| 2013/0061492 | A1 | 3/2013 | Okuchi et al. |
| 2014/0174482 | A1 | 6/2014 | Sato et al. |

\* cited by examiner

SUBSTRATE PROCESSING METHOD AND STORAGE MEDIUM

CROSS-REFERENCE TO RELATED APPLICATIONS

This application claims the priority benefit of Japanese Patent Application No. 2012-159850, filed on Jul. 18, 2012, the disclosure of which is incorporated herein by reference in its entirety.

TECHNICAL FIELD

The present invention relates to a technique for removing a liquid from a substrate surface by using a high-pressure fluid in a supercritical or subcritical state.

BACKGROUND ART

In a semiconductor device manufacturing process for forming a laminated integrated circuit structure in a surface of a semiconductor wafer (hereinafter simply referred to as "wafer") as a substrate, a liquid processing step is provided for carrying out processing of a wafer surface, such as removal of small foreign matter or a natural oxide film from the wafer surface, e.g. by using a cleaning liquid such as a liquid chemical.

As semiconductor devices are becoming more highly integrated, a phenomenon called pattern collapse, which can occur when removing a liquid which has adhered to a wafer surface in such a liquid processing step, is becoming a serious problem. The pattern collapse is a phenomenon in which a liquid, remaining on both sides of a raised portion (i.e. remaining in recessed portions) of a three-dimensional pattern, is unevenly removed upon drying of the wafer surface whereby a surface tension, acting sideways on the raised portion, becomes unbalanced and the raised portion collapses toward the side where a larger amount of the liquid remains.

A method using a fluid in a supercritical state or a subcritical state (hereinafter collectively referred to as a "high-pressure state") is known as a method to remove a liquid from a wafer surface while preventing the occurrence of pattern collapse. A fluid in a high-pressure state (high-pressure fluid) has a lower viscosity than other liquid and has a high ability to extract a liquid. In addition, no interface exists between a high-pressure fluid and a liquid or a gas in equilibrium with the fluid. Therefore, a liquid adhering to a wafer surface can be removed, without being influenced by the surface tension, by replacing the liquid on the wafer surface with a high-pressure fluid, and then changing the high-pressure fluid into a gas.

The applicant has developed a liquid processing apparatus in which a wafer is subjected to liquid processing, performed by supplying a processing liquid onto the surface of the rotating wafer, in a single-wafer liquid processing unit, and the wafer after the liquid processing, the surface of which is covered with an anti-drying liquid, is transported to a high-pressure fluid processing unit, where the anti-drying liquid is removed from the wafer in a processing container. Patent document 1, for example, teaches the use of HFE (hydrofluoroether), a fluorine-containing organic solvent (described as "fluorine compound" in patent document 1), as an anti-drying liquid and also as a high-pressure fluid from the viewpoints of high replaceability of the high-pressure fluid with a liquid and ability to prevent bringing-in of moisture from liquid processing. A fluorine-containing organic solvent is suitable as an anti-drying liquid also because of its flame retardancy properties.

On the other hand, a fluorine-containing organic solvent such as HFE, HFC (hydrofluorocarbon) or PFC (perfluorocarbon) is more expensive than IPA (isopropyl alcohol) or the like; a loss of such a fluorine-containing organic solvent due to its evaporation during transportation of a wafer leads to an increase in the operating cost. In order to reduce the evaporation loss, fluorine-containing organic solvents having a high boiling point (having a low vapor pressure) are used as an anti-drying liquid and as a high-pressure fluid. A fluorine-containing organic solvent having a high boiling point, however, generally has a high critical temperature, and therefore can decompose in a high-temperature and high-pressure atmosphere to generate hydrogen fluoride (HF), etc., which may cause damage to a wafer. Further, when an anti-drying liquid having a high boiling point is brought into a processing container and the liquid is subjected to processing to remove the liquid, the resulting fluid can condense in the processing container, causing pattern collapse.

PRIOR ART DOCUMENT

Patent Document

Patent document 1: Japanese Patent Laid-Open Publication No. 2011-187570, claim 1, paragraphs 0021-0022 and 0072-0077, and FIG. 4

SUMMARY OF THE INVENTION

The present invention has been made under such circumstances. Therefore, the object of the present invention is to provide a substrate processing method and a substrate processing apparatus which can prevent evaporation of an anti-drying fluorine-containing organic solvent from a substrate during transportation of the substrate into a processing container and can also prevent decomposition of a fluorine-containing organic solvent in the processing container, and to provide a storage medium storing a program for performing the substrate processing method.

In order to achieve the object, the present invention provides a substrate processing method for removing a fluorine-containing organic solvent, which has been supplied to a surface of a substrate, having a pattern formed in the surface, after processing of the substrate with a liquid and which covers the surface of the substrate, from the surface of the substrate by bringing the solvent into contact with a high-pressure fluid, said method comprising the steps of: carrying the substrate, the surface of which is covered with a first fluorine-containing organic solvent, into a processing container; forming a high-pressure fluid atmosphere of a mixture of the first fluorine-containing organic solvent and a second fluorine-containing organic solvent, having a lower boiling point than that of the first fluorine-containing organic solvent, in the processing container, in which the substrate is housed, by supplying a high-pressure fluid of the second fluorine-containing organic solvent into the processing container, or by supplying a gas or liquid of the second fluorine-containing organic solvent into the processing container and then heating the gas or liquid to a temperature not less than a critical temperature of the second fluorine-containing organic solvent to turn the gas or liquid into a high-pressure fluid; and then discharging a fluid in the state of a high-pressure fluid or a gas from the processing container.

The substrate processing method of the present invention may have the following features:

(a) The critical temperature of the second fluorine-containing organic solvent is higher than the boiling point of the first fluorine-containing organic solvent;
(b) The high-pressure fluid atmosphere of the mixture is formed in the processing container when stopping the supply of the second fluorine-containing organic solvent.
(c) The boiling point of the first fluorine-containing organic solvent is not less than 100° C.;
(d) The critical temperature of the second fluorine-containing organic solvent is not more than 200° C.;
(e) The mol-based mixing ratio of the first fluorine-containing organic solvent to the second fluorine-containing organic solvent is not more than 1/10; and
(f) The internal temperature of the processing container in the step of forming a high-pressure fluid atmosphere of the mixture is so determined as to make the content of fluorine, generated by decomposition of the fluorine-containing organic solvents of the mixture, in the fluid discharged from the processing container not more than 100 weight ppm.

According to the present invention, a substrate is transported to the processing container while the surface of the substrate is covered with the first fluorine-containing organic solvent having a higher boiling point (lower vapor pressure) than the second fluorine-containing organic solvent for use as a material for a high-pressure fluid. The first fluorine-containing organic solvent evaporates only in a small amount during transportation of the substrate.

DETAILED DESCRIPTION OF THE PREFERRED EMBODIMENTS

A liquid processing apparatus 1, which is an exemplary substrate processing apparatus according to the present invention, includes a liquid processing unit 2 for supplying a processing liquid to a wafer W as a substrate to perform processing of the wafer W with the liquid, and a supercritical processing unit 3 (high-pressure fluid processing unit) for removing an anti-drying liquid, adhering to the wafer W after the liquid processing, by bringing the liquid into contact with a supercritical fluid (high-pressure fluid).

Figure 1:
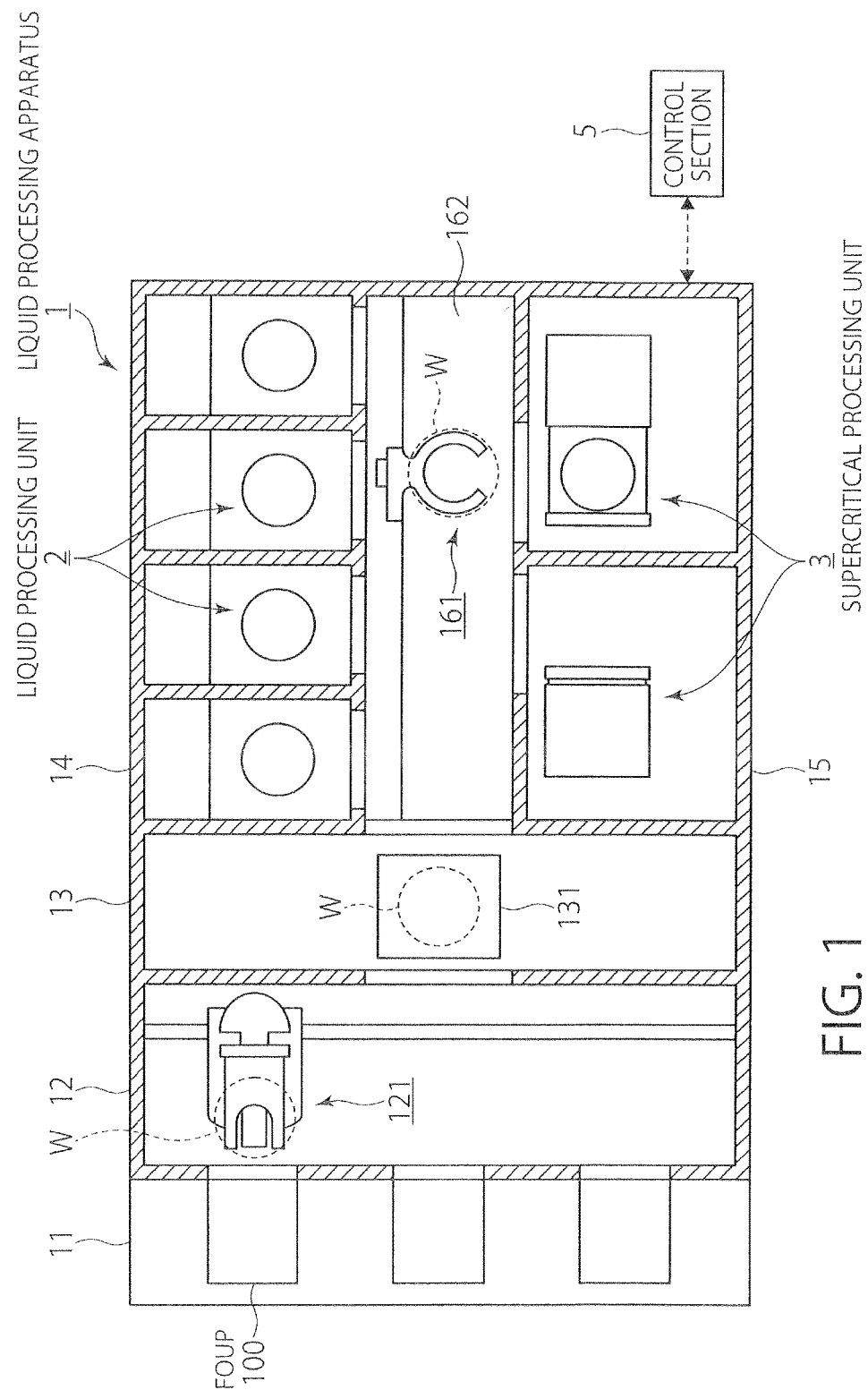
FIG. 1 is a cross-sectional plan view of a liquid processing apparatus according to an embodiment of the present invention.

FIG. 1 is a cross-sectional plan view showing the overall construction of the liquid processing apparatus 1. In FIG. 1, the left side will be referred to as the anterior side. In the liquid processing apparatus 1, FOUPs 100 are placed on a loading section 11. A plurality of wafers W, e.g. having a diameter of 300 mm, stored in each FOUP 100 are transferred between the FOUP and a liquid processing section 14, a supercritical processing section 15 via a carry-in/carry-out section 12 and a transfer section 13; the wafers W are sequentially carried into a liquid processing unit 2 and a supercritical processing unit 3, where each wafer W is subjected to processing with a liquid and to removal of an anti-drying liquid, respectively. In FIG. 1, reference numeral 121 represents a first transport mechanism for transporting a wafer W between each FOUP 100 and the transfer section 13, and 131 represents a transfer shelf which serves as a buffer for temporarily placing thereon a wafer W during its transportation between the carry-in/carry-out section 12 and the liquid processing section 14, the supercritical processing section 15.

The liquid processing section 14 and the supercritical processing section 15 are located on either side of a wafer transport space 162 anteroposteriorly extending from an opening provided between it and the transfer section 13. The liquid processing section 14, located on the left of the transport space 162 as viewed from the anterior side, has e.g. four liquid processing units 2 disposed along the wafer transport space 162. The supercritical processing section 15, located on the right of the transport space 162 has e.g. two supercritical processing units 3 disposed along the transport space 162.

A wafer W is transported between one of the liquid processing units 2, one of the supercritical processing units 3 and the transfer section 13 by a second transport mechanism 161 disposed in the transport space 162. The second transport mechanism 161 corresponds to a substrate transport unit according to the present invention. The numbers of the liquid processing units 2 and the supercritical processing units 3, disposed in the liquid processing section 14 and the supercritical processing section 15, may be arbitrarily selected depending on the number of wafers W to be processed per unit time, the difference in processing time between the liquid processing unit 2 and the supercritical processing unit 3, etc. An optimal layout may be determined based on the number of the liquid processing units 2, the number of the supercritical processing units 3, etc.

The liquid processing unit 2 may be configured e.g. as a single-wafer liquid processing (cleaning) unit which cleans wafers W in a one-by-one manner by spin cleaning. In particular, as shown in the vertical sectional side view of FIG. 2, the liquid processing unit 2 includes an outer chamber 21 that defines a processing space, a wafer holding mechanism 23, disposed in the outer chamber 21, for rotating a wafer W on a vertical axis while holding the wafer W in an approximately horizontal position, an inner cup 22, disposed such that it surrounds the periphery of the wafer holding mechanism 23, for receiving a liquid scattering from the wafer W, and a nozzle arm 24 having a nozzle 241 at the front end and which is configured to be movable between a position above the wafer W and a standby position.

To the nozzle 241 are connected a processing liquid supply section 201 for supplying a liquid chemical, a rinsing liquid supply section 202 for supplying a rinsing liquid, and a first fluorine-containing organic solvent supply section 203 (first organic solvent supply section) for supplying a first fluorine-containing organic solvent, which is an anti-drying liquid, to the surface (front surface) of the wafer W. The first fluorine-containing organic solvent differs from the below-described second fluorine-containing organic solvent for use in supercritical processing. There is a predetermined relationship in terms of boiling points and critical temperatures between the first fluorine-containing organic solvent and the second fluorine-containing organic solvent, as will be described in detail below.

A chemical supply passage 231 may be formed in the interior of the wafer holding mechanism 23 in order to clean the back surface of the wafer W with a liquid chemical and a rinsing liquid, both supplied through the chemical supply passage 231. The outer chamber 21 and the inner cup 22 are provided in their bottoms with an exhaust port 212 for discharging the internal atmosphere and liquid discharge ports 221, 211 for discharging a liquid that has been scattered from the wafer W.

After the completion of liquid processing of the wafer W in the liquid processing unit 2, the wafer W, whose surface is covered with the anti-drying first fluorine-containing organic solvent, is transported by the second transport mechanism 161 to one of the supercritical processing units 3. In the supercritical processing unit 3, the wafer W is brought into contact with the second fluorine-containing organic solvent in the state of a supercritical fluid to remove the first fluorine-containing organic solvent from the wafer W, thereby drying the wafer W. The construction of the supercritical processing unit 3 will now be described with reference to FIGS. 3 and 4.

The supercritical processing unit 3 includes a processing container 31 for performing processing to remove the anti-drying liquid (first fluorine-containing organic solvent) adhering to the surface of a wafer W, and a supercritical fluid supply section 41 (second organic solvent supply section) for supplying a supercritical fluid of the second fluorine-containing organic solvent to the processing container 31.

Figure 4:
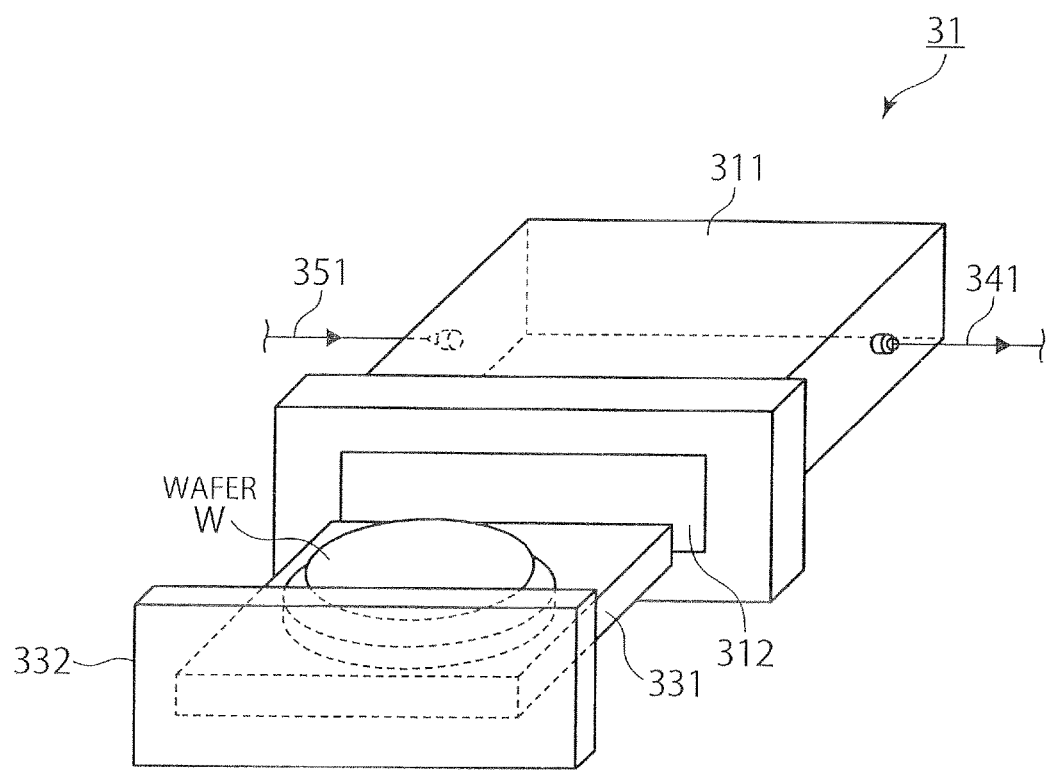
FIG. 4 is an external perspective view of the processing container of the supercritical processing unit.

As shown in FIG. 4, the processing container 31 includes a box-like container body 311 having an opening 312 for transfer of a wafer W, a wafer tray 331 capable of holding the wafer W as a processing object in a horizontal position, and a lid member 332 which supports the wafer tray 331 and, when the wafer W is carried into the container body 311, hermetically closes the opening 312.

The container body 311 is a container having a processing space of about 200 to 10000 cm³ and capable of housing a wafer W e.g. having a diameter of 300 mm. A supercritical fluid supply line 351 for supplying the supercritical fluid into the processing container 31, and a discharge line 341 (discharge section) for discharging a fluid from the processing container 31 and which is provided with an on-off valve 342, are connected to the side walls of the container body 311. The processing container 31 is provided with a not-shown pressing mechanism for pressing the lid member 332 toward the container body 311 against the internal pressure of the high-pressure processing fluid that has been supplied into the processing space, thereby hermetically sealing the processing space.

The container body 311 is provided with a heater 322 as a heating section, e.g. comprised of a resistance heating element, and a temperature detection section 323 having a thermocouple or the like to detect the internal temperature of the processing container 31. The internal temperature of the processing container 31 is raised to a preset temperature by heating the container body 311, so that the wafer W in the processing container 31 can be heated. The amount of heat generated by the heater 322 can be changed by changing the power supplied from a power feeding section 321. Based on the results of temperature detection obtained from the temperature detection section 323, the internal temperature of the processing container 31 is controlled at a preset temperature.

The supercritical fluid supply section 41 is connected to the upstream side of the supercritical fluid supply line 351 which is provided with an on-off valve 352. The supercritical fluid supply section 41 includes a spiral pipe 411 which is to prepare a supercritical fluid of the second fluorine-containing organic solvent, to be supplied into the processing container 31, a second fluorine-containing organic solvent supply section 414 for supplying a liquid of the second fluorine-containing organic solvent as a material for the supercritical fluid, and a halogen lamp 413 for heating the spiral pipe 411 to turn the second fluorine-containing organic solvent in the liquid state, held in the spiral pipe 411, into a supercritical state.

The spiral pipe 411 is a cylindrical container, formed by spiraling e.g. a stainless steel pipe member in the longitudinal direction. The spiral pipe 411 is coated e.g. with a black radiation heat-absorbing paint in order to promote absorption of heat radiated from the halogen lamp 413. The halogen lamp 413 is disposed along the central axis of the cylindrical spiral pipe 411, keeping a distance from the inner peripheral surface of the spiral pipe 411. A power source section 412 is connected to the lower end of the halogen lamp 413. The halogen lamp 413 is caused to radiate heat by a power supplied from the power source section 412; the radiation heat is mainly utilized to heat the spiral pipe 411. The power source section 412 is connected to a not-shown temperature detection section provided in the spiral pipe 411 so that based on a detected temperature, the power supplied to the halogen lamp 413 can be adjusted and the interior of the spiral pipe 411 can be heated to a preset temperature.

A pipe member extends from the lower end of the spiral pipe 411, constituting a receiver line 415 for the second fluorine-containing organic solvent. The receiver line 415 is connected to the second fluorine-containing organic solvent supply section 414 via a pressure-resistant on-off valve 416. The second fluorine-containing organic solvent supply section 414 is provided with a tank for storing the second fluorine-containing organic solvent in the liquid state, a liquid feeding pump, a flow control mechanism, etc.

Figure 2:
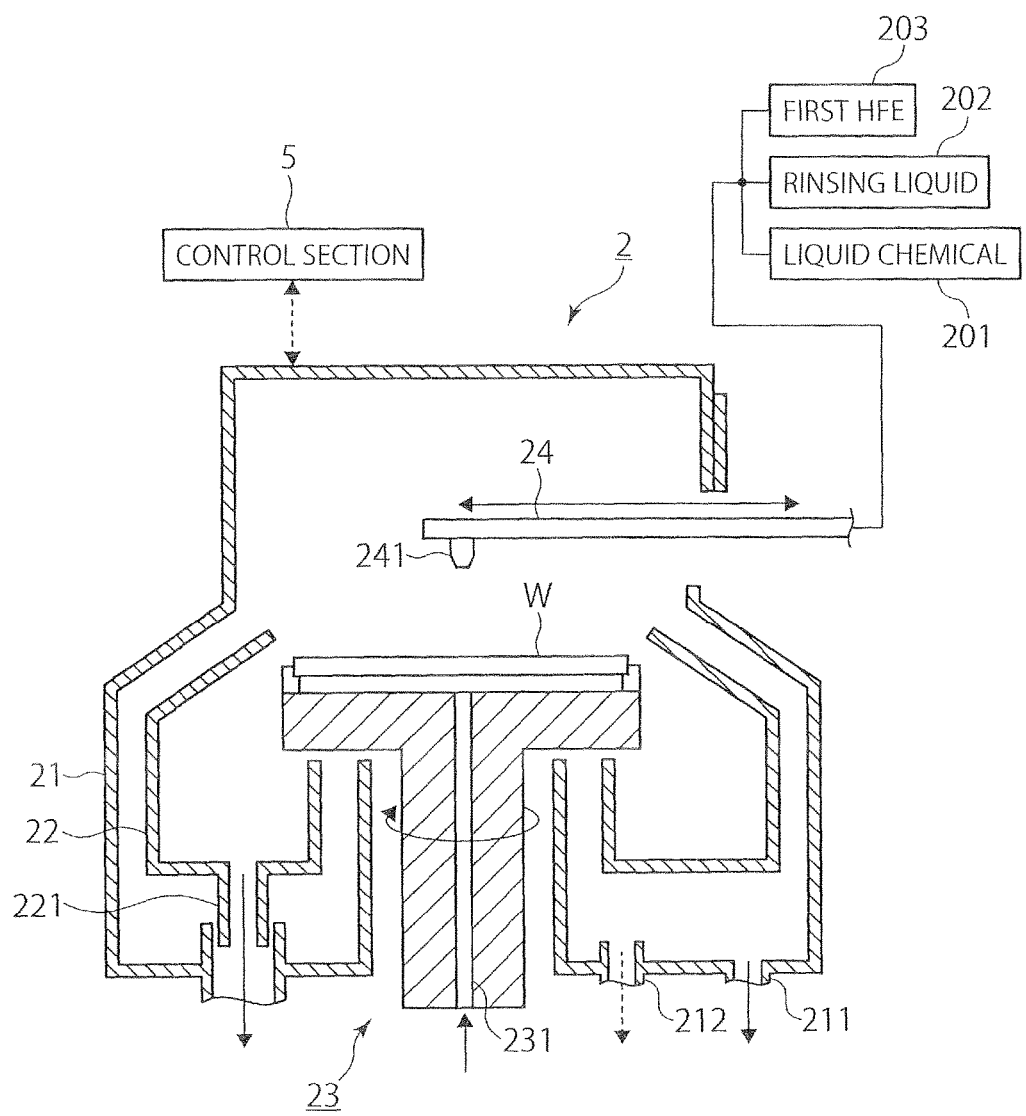
FIG. 2 is a vertical sectional side view of a liquid processing unit provided in the liquid processing apparatus.
Figure 3:
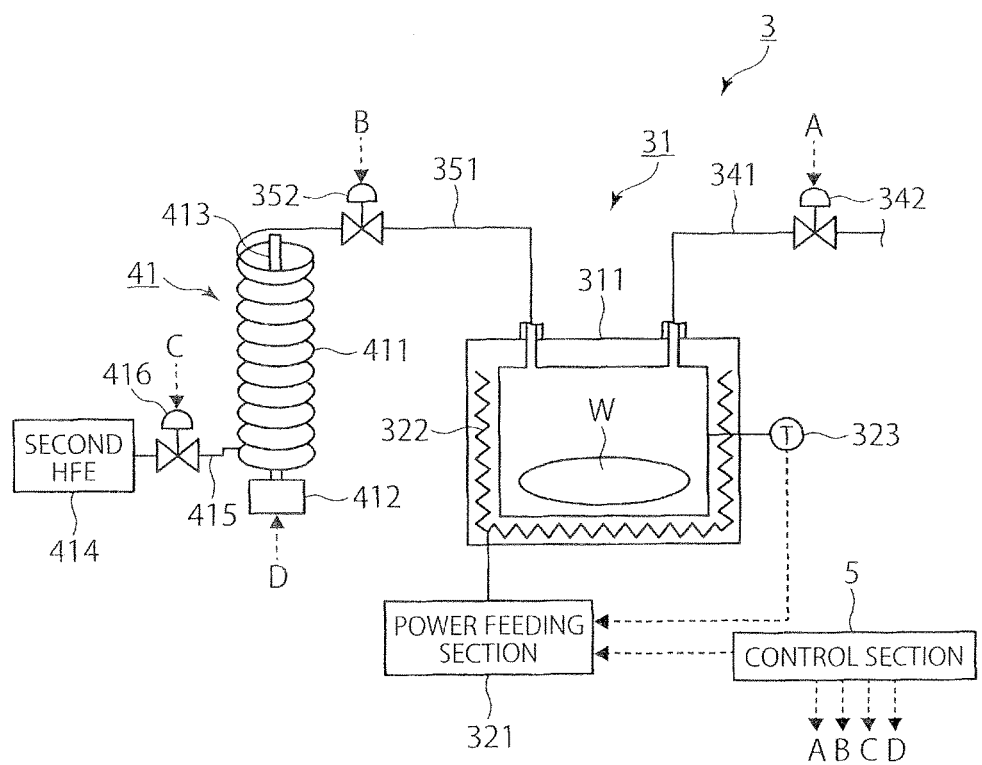
FIG. 3 is a diagram showing the construction of a supercritical processing unit provided in the liquid processing apparatus.

The liquid processing apparatus 1, including the liquid processing units 2 and the supercritical processing units 3 having the above-described construction, is connected to a control section 5 as shown in FIGS. 1 through 3. The control section 5 is comprised of a computer including a CPU and a storage unit. The storage unit stores a program containing steps (commands) for control of the operations of the liquid processing apparatus 1 in the process comprising taking a wafer W out of the FOUP 100, processing the wafer W in the liquid processing unit 2, drying the wafer W in the supercritical processing unit 3, and then carrying the wafer W into the FOUP 100. The program is stored in a storage medium, such as a hard disk, a compact disk, a magneto-optical disk, a memory card, or the like, and is installed on the computer from the storage medium.

The first fluorine-containing organic solvent, which is to be supplied to the surface of a wafer W in the liquid processing unit 2, and the second fluorine-containing organic solvent, which is to be supplied in the state of a supercritical fluid to the processing container 31 so as to remove the first fluorine-containing organic solvent from the surface of the wafer W, will now be described. Both the first fluorine-containing organic solvent and the second fluorine-containing organic solvent are fluorine-containing organic solvents containing a fluorine atom(s) in the hydrocarbon molecule.

Exemplary combinations of the first fluorine-containing organic solvent and the second fluorine-containing organic solvent are shown below in Table 1.

TABLE 1

| | Manufacturer | Product name | Compound name | Boiling point [° C.] | Critical temp. [° C.] |
|---|---|---|---|---|---|
| First fluorine-containing organic solvent | Asahi Glass | Asahiklin AC-6000 (registered trademark) | HFC | 115 | 233 |
| | Sumitomo 3M | Novec 7500 (registered trademark) | HFE | 128 | 261 |
| | Sumitomo 3M | Fluorinate FC-40 (registered trademark) | PFC | 165 | 270 |
| | Sumitomo 3M | Fluorinate FC-43 (registered trademark) | PFC | 174 | 294 |
| | Sumitomo 3M | Fluorinate FC-3283 (registered trademark) | PFC | 128 | 235 |
| Second fluorine-containing organic solvent | Sumitomo 3M | Fluorinate FC-72 (registered trademark) | PFC | 56 | 177 |
| | Asahi Glass | Asahiklin AE-3000 (registered trademark) | HFE | 56 | 187 |
| | Sumitomo 3M | Novec 7100 (registered trademark) | HFE | 61 | 195 |
| | Asahi Glass | Asahiklin AC-2000 (registered trademark) | HFC | 68 | 195 |

In Table 1, "HFE" (hydrofluoroether) is a fluorine-containing organic solvent in which some of the hydrogen atoms of the hydrocarbon molecule having an ether bond are substituted with fluorine atoms; "HFC" (hydrofluorocarbon) is a fluorine-containing organic solvent in which some of the hydrogen atoms of the hydrocarbon molecule are substituted with fluorine atoms; and "PFC" (perfluorocarbon) is a fluorine-containing organic solvent in which all of the hydrogen atoms of the hydrocarbon molecule are substituted with fluorine atoms.

When one of these fluorine-containing organic solvents is selected as the second fluorine-containing organic solvent, a fluorine-containing organic solvent having a higher boiling point (lower vapor pressure) than that of the selected second fluorine-containing organic solvent is selected as the first fluorine-containing organic solvent. This makes it possible to reduce the amount of the fluorine-containing organic solvent that evaporates from the surface of a wafer W during transportation of the wafer W from the liquid processing unit 2 to the supercritical processing unit 3, compared to the case where the second fluorine-containing organic solvent is used as an anti-drying liquid.

The first fluorine-containing organic solvent preferably has a boiling point of not less than 100° C. A fluorine-containing organic solvent having a boiling point of not less than 100° C. evaporates only in a small amount during transportation of a wafer W: The surface of the wafer W can be kept wet for about tens of seconds to 10 minutes by supplying the fluorine-containing organic solvent to the wafer surface even in a small amount, for example, about 0.01 to 5 cc in the case of a 300-mm wafer and about 0.02 to 10 cc in the case of a 450-mm wafer. In comparison, IPA (isopropyl alcohol) must be supplied to the surface of a wafer W in an amount of about 10 to 50 cc in order to keep the wafer surface in a wet state for the same time period. A commercially-available product Asahiklin (registered trademark) AC-6000 (hereinafter simply referred to as "AC-6000") having a boiling point of 115° C., manufactured by Asahi Glass Co., Ltd. as shown in Table 1, is an example of the fluorine-containing organic solvent having a boiling point of not less than 100° C.

When two fluorine-containing organic solvents are selected, one having a higher (lower) boiling point has a higher (lower) supercritical temperature. Thus, when a fluorine-containing organic solvent having a lower boiling point is selected as the second fluorine-containing organic solvent, the second solvent can form a supercritical fluid at a low temperature, making it possible to prevent release of fluorine atoms due to decomposition of the fluorine-containing organic solvents.

It is preferred to select a fluorine-containing organic solvent which becomes a supercritical fluid at such a temperature that the content of fluorine, generated by decomposition of the first and second fluorine-containing organic solvents, in a fluid discharged from the processing container 31 after processing, is not more than 100 weight ppm. This serves as an index of a low-boiling fluorine-containing organic solvent. A fluorine-containing organic solvent, having a critical temperature of not more than 200° C., may be a candidate for the second fluorine-containing organic solvent that can meet the index. A commercially-available product Fluorinert (registered trademark) FC-72 (hereinafter simply referred to as "FC-72") having a boiling point of 177° C., available from Sumitomo 3M Limited as shown in Table 1, is an example of such a fluorine-containing organic solvent.

In addition to the second fluorine-containing organic solvent that has been supplied in the form of a supercritical fluid, the first fluorine-containing organic solvent, having a higher boiling point (higher critical temperature) than that of the second fluorine-containing organic solvent, is present in the processing container 31 of this embodiment. It is therefore necessary to confirm that when a fluorine-containing organic solvent having a low critical temperature is used as the second fluorine-containing organic solvent, the first fluorine-containing organic solvent having a higher critical temperature can be removed from a wafer W while preventing decomposition of the first solvent.

Figure 5:
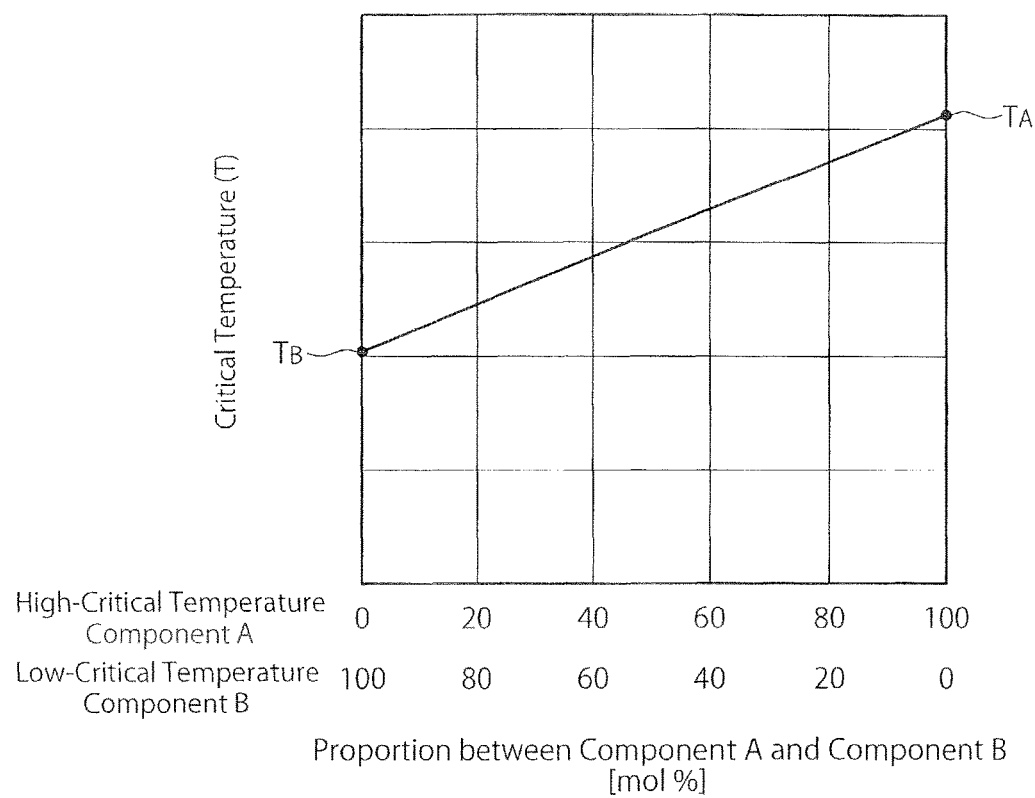
FIG. 5 is an explanatory diagram illustrating change in the critical temperature of a two-component mixed fluid.

FIG. 5 illustrates change in the critical temperature of a two-component mixed fluid, consisting of IPA as a high-critical temperature component A and $CO_2$ as a low-critical temperature component B, with change in the mixing ratio between the components A and B. As can be seen in FIG. 5, the mixture of the components A and B becomes a super-critical state at a temperature near the critical temperature $T_B$ of the low-critical temperature component B when the mixing ratio of the high-critical temperature component A (critical temperature $T_A$) to the low-critical temperature component B (critical temperature $T_B$) is sufficiently low.

The same holds true for a mixture of the first fluorine-containing organic solvent (high-critical temperature component) and the second fluorine-containing organic solvent (low-critical temperature component): The mixture of the first fluorine-containing organic solvent and the second fluorine-containing organic solvent can become a supercritical state at a temperature near the critical temperature of the second fluorine-containing organic solvent when the mol-based mixing ratio of the first fluorine-containing organic solvent to the second fluorine-containing organic solvent is not more than 1/10 (the mol-based mixing ratio of the second fluorine-containing organic solvent to the first fluorine-containing organic solvent is not less than 10). Therefore, the high-critical temperature component (first fluorine-containing organic solvent) can be removed at a temperature at which the respective fluorine-containing organic solvents hardly decompose.

Because fluorine-containing organic solvents, which are similar in the properties, are used respectively as a liquid that covers the surface of a wafer W and as a supercritical fluid, the mixture is well miscible after it has become a supercritical state. Therefore, the first fluorine-containing organic solvent can be removed even if the supply of a supercritical fluid of the second fluorine-containing organic solvent is stopped after supplying a predetermined amount of the supercritical fluid and even without discharging the liquid (first fluorine-containing organic solvent) from the processing container 31 by continuously supplying and discharging the supercritical fluid. This has been confirmed experimentally (see the Examples).

When a supercritical fluid of a mixture containing a high-boiling component (first fluorine-containing organic solvent) is formed at a relatively low temperature, the internal temperature of the processing container 31 can drop below the dew point upon discharge of the supercritical fluid from the discharge line 341. The first fluorine-containing organic solvent will then condense on the surface of a wafer W, which may cause pattern collapse. In this embodiment, therefore, the first and second fluorine-containing organic solvents are selected in such a manner that the supercritical temperature of the second fluorine-containing organic solvent is higher than the boiling point of the first fluorine-containing organic solvent, so that the mixture of the fluorine-containing organic solvents can be discharged from the processing container 31 while keeping the mixture in the state a supercritical fluid or a gas.

In the liquid processing apparatus 1 of this embodiment, the first fluorine-containing organic solvent which is to be supplied onto the surface of a wafer W, and the second fluorine-containing organic solvent for removing the first fluorine-containing organic solvent from the wafer W, are selected based on the concept described hereinabove. The operation of the liquid processing apparatus 1 will now be described with reference to FIGS. 6 through 14, taking as an example the case of selecting "AC-6000" as the first fluorine-containing organic solvent and "FC-72" as the second fluorine-containing organic solvent, the fluorine-containing organic solvents both satisfying the above-described requirements.

First, a wafer W is taken out of the FOUP 100 and transported into the liquid processing section 14 via the carry-in/carry-out section 12 and the transfer section 13, and the wafer W is transferred to the wafer holding mechanism 23 of one of the liquid processing units 2. Liquid processing of the wafer W is carried out by supplying a processing liquid onto the surface of the rotating wafer W.

Liquid processing (cleaning) of the wafer W may, for example, be carried out as follows: removal of particles or an organic contaminant with an SC1 liquid (mixture of ammonia and hydrogen peroxide water) which is an alkaline chemical→rinsing with DIW (deionized water) as a rinsing liquid→removal of a natural oxide film with DHF (diluted hydrofluoric acid) which is an acidic chemical→rinsing with DIW.

Figure 11:
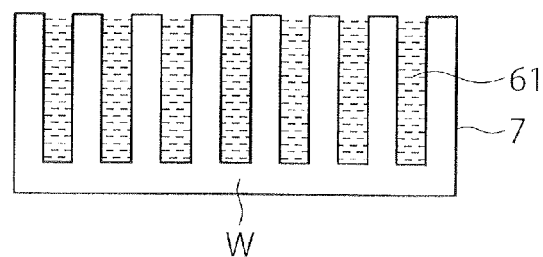
FIG. 11 is a first explanatory diagram illustrating the state of a wafer being processed in the supercritical processing unit.

Upon the completion of liquid processing with a chemical and rinsing of the wafer W, IPA is supplied from the processing liquid supply section 201 to the surface of the rotating wafer W to replace DIW, remaining on the front and back surfaces of the wafer W, with the IPA. When the liquid on the surface of the wafer W has been fully replaced with IPA, the first fluorine-containing organic solvent is supplied onto the surface of the rotating wafer W from the first fluorine-containing organic solvent supply section 203, and then the rotation of the wafer W is stopped. After the rotation is stopped, the surface of the wafer W is covered with the first fluorine-containing organic solvent e.g. in an amount of 2 cc. As illustrated in FIG. 11, the surface pattern 7 of the wafer W is filled with the liquid 61 of the first fluorine-containing organic solvent.

The wafer W after the liquid processing is carried out of the liquid processing unit 2 by the second transport mechanism 161 and transported to one of the supercritical processing units 3. Because of the use of a fluorine-containing organic solvent having a high boiling point (low vapor pressure) as the first fluorine-containing organic solvent, the amount of the fluorine-containing organic solvent that evaporates from the surface of the wafer W during transportation of the wafer W can be made small.

Figure 6:
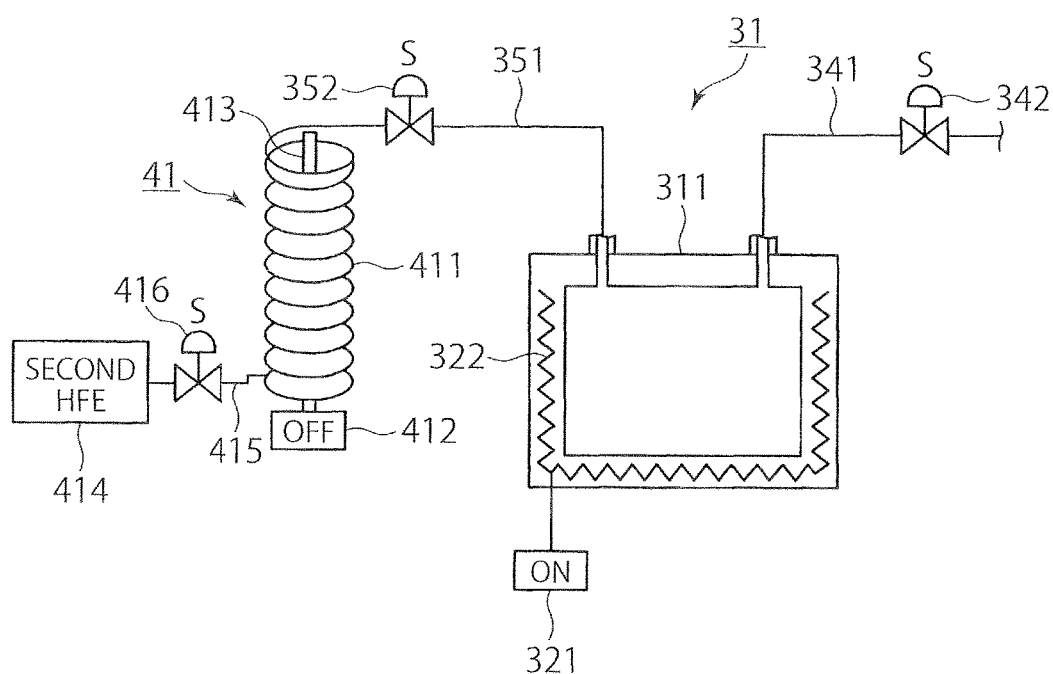
FIG. 6 is a first explanatory diagram illustrating the action of the supercritical processing unit.

The supercritical processing unit 3, on the other hand, has been in a standby state with the power feeding section 321 "on" as shown in FIG. 6 so that the interior of the processing container 31 is kept heated at 200° C., which is about 23° C. higher than the critical temperature of the second fluorine-containing organic solvent. In FIGS. 6 through 10, the symbol "S" used for each on-off valve 342,352,416 indicates that the valve is closed, whereas the symbol "O" indicates that the valve is open.

At a certain time before the wafer W is carried into the processing container 31, the on-off valve 416 of the supercritical fluid supply section 41 is opened to feed a predetermined amount of the liquid of the second fluorine-containing organic solvent from the second fluorine-containing organic solvent supply section 414. Thereafter, the on-off valves 352, 416 are closed to seal off the spiral pipe 411. The liquid of the second fluorine-containing organic solvent accumulates on the lower side of the spiral pipe 411, leaving a space on the upper side of the spiral pipe 411. When the second fluorine-containing organic solvent is heated, the evaporated solvent expands in the space.

Figure 7:
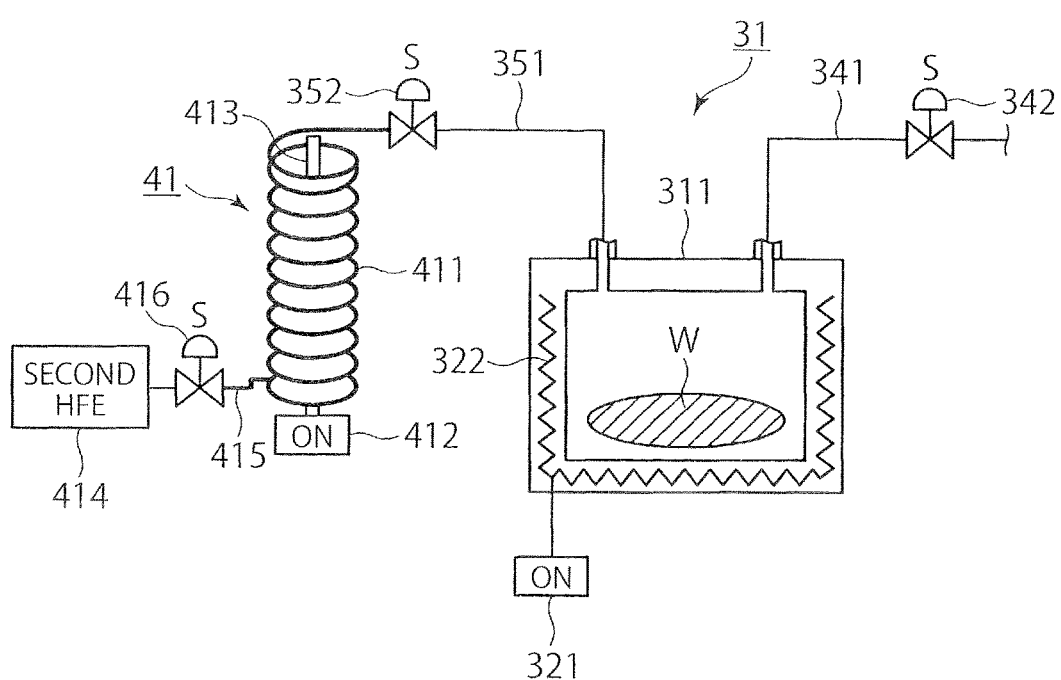
FIG. 7 is a second explanatory diagram illustrating the action of the supercritical processing unit.

Thereafter, feeding of electricity from the power source section 412 to the halogen lamp 413 is started as shown in FIG. 7 to cause the halogen lamp 413 to generate heat. The interior of the spiral pipe 411 is therefore heated, whereby the second fluorine-containing organic solvent evaporates. The temperature and the pressure of the evaporated solvent are raised to the supercritical temperature and the supercritical pressure, whereby the solvent becomes a supercritical fluid. The second fluorine-containing organic solvent in the spiral pipe 411 is heated to such a high temperature and pressure that the solvent can maintain the critical pressure and the critical temperature when it is supplied into the processing container 31.

The wafer W, which has undergone the liquid processing and whose surface is covered with the first fluorine-containing organic solvent, is carried into the supercritical processing unit 3 which is ready to supply the supercritical fluid of the second fluorine-containing organic solvent.

Figure 8:
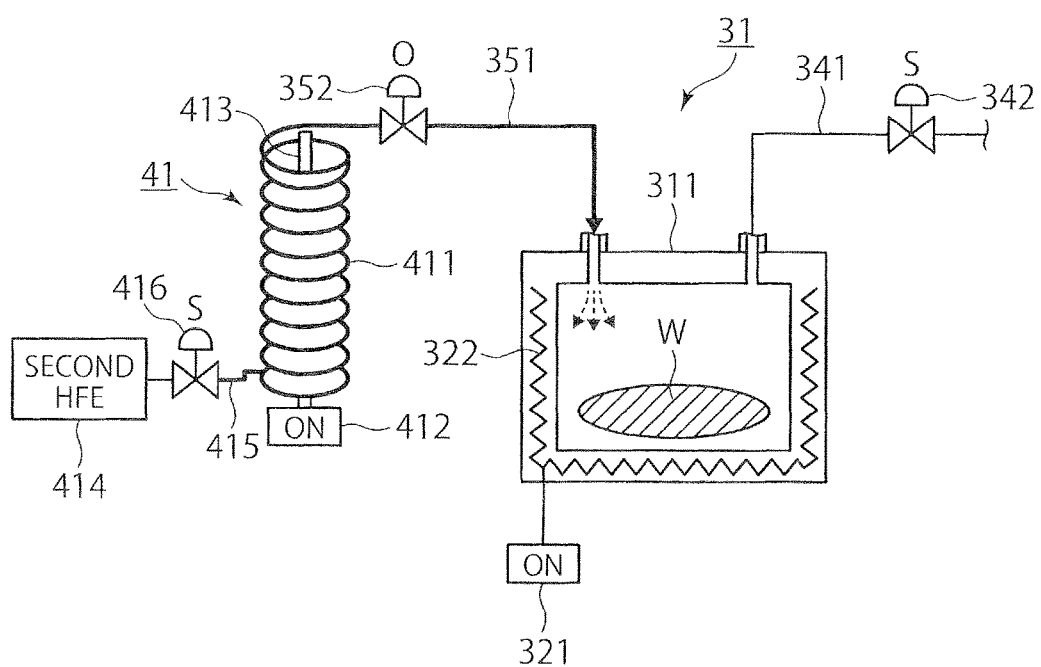
FIG. 8 is a third explanatory diagram illustrating the action of the supercritical processing unit.

As shown in FIG. 7, after the wafer W is carried into the processing container 31 and the lid member 332 is closed to hermetically seal the processing container 31, the on-off valve 352 of the supercritical fluid supply line 351 is opened to supply the supercritical fluid of the second fluorine-containing organic solvent from the supercritical fluid supply section 41 before the first fluorine-containing organic solvent evaporates from the surface of the wafer W (FIG. 8).

Figure 9:
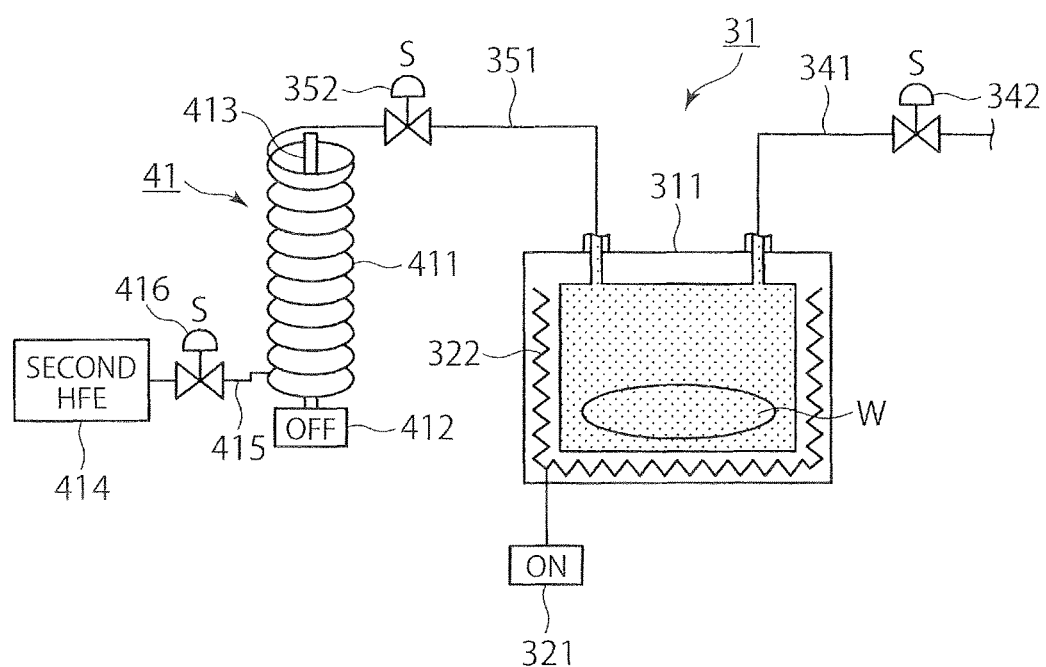
FIG. 9 is a fourth explanatory diagram illustrating the action of the supercritical processing unit.

When the internal atmosphere of the processing container 31 has become that of the supercritical fluid of the second fluorine-containing organic solvent that has been supplied from the supercritical fluid supply section 41, the on-off valve 352 of the supercritical fluid supply line 351 is closed as shown in FIG. 9. The halogen lamp 413 of the supercritical fluid supply section 41 is turned off and the fluid in the spiral pipe 411 is discharged through a not-shown depressurizing line so that in order to prepare the next supercritical fluid, the supercritical fluid supply section 41 becomes prepared to receive the second fluorine-containing organic solvent in the liquid state from the second fluorine-containing organic solvent supply section 414.

Figure 12:
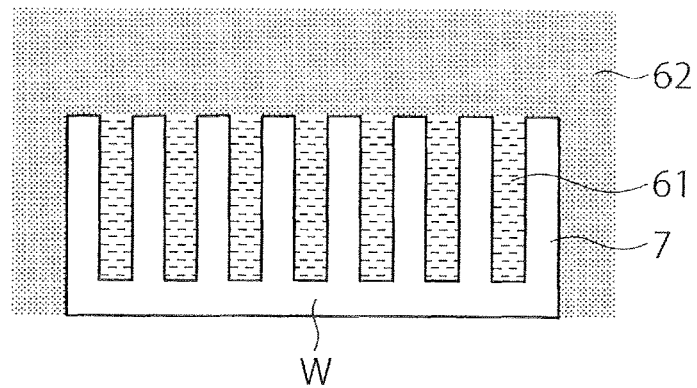
FIG. 12 is a second explanatory diagram illustrating the state of the wafer being processed.

After the supply of the supercritical fluid into the processing container 31 is stopped, the interior of the processing chamber 31 is kept hermetically sealed and filled with the supercritical fluid of the second fluorine-containing organic solvent. With regard to the wafer W in the processing chamber 31, the supercritical fluid 62 of the second fluorine-containing organic solvent is in contact with the liquid 61 of the first fluorine-containing organic solvent that fills the surface pattern 7, as shown in FIG. 12.

Figure 13:
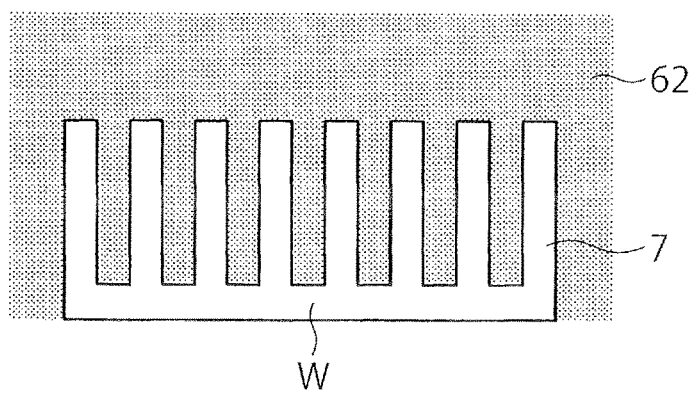
FIG. 13 is a third explanatory diagram illustrating the state of the wafer being processed.

When the liquid 61 is kept in contact with the supercritical fluid 62, the first and second fluorine-containing organic solvents, which are miscible with each other, are mixed and the liquid 61 in the pattern 7 is replaced with the supercritical fluid 62. Eventually, as shown in FIG. 13, the liquid 61 will be removed from the surface of the wafer W, and an atmosphere of the supercritical fluid of the mixture of the first and second fluorine-containing organic solvents will be formed around the pattern 7. Because the liquid 61 of the first fluorine-containing organic solvent can be removed at a relatively low temperature near the critical temperature of the second fluorine-containing organic solvent, the fluorine-containing organic solvents hardly decompose, generating only a little amount of hydrogen fluoride which may cause damage to the pattern 7.

Figure 10:
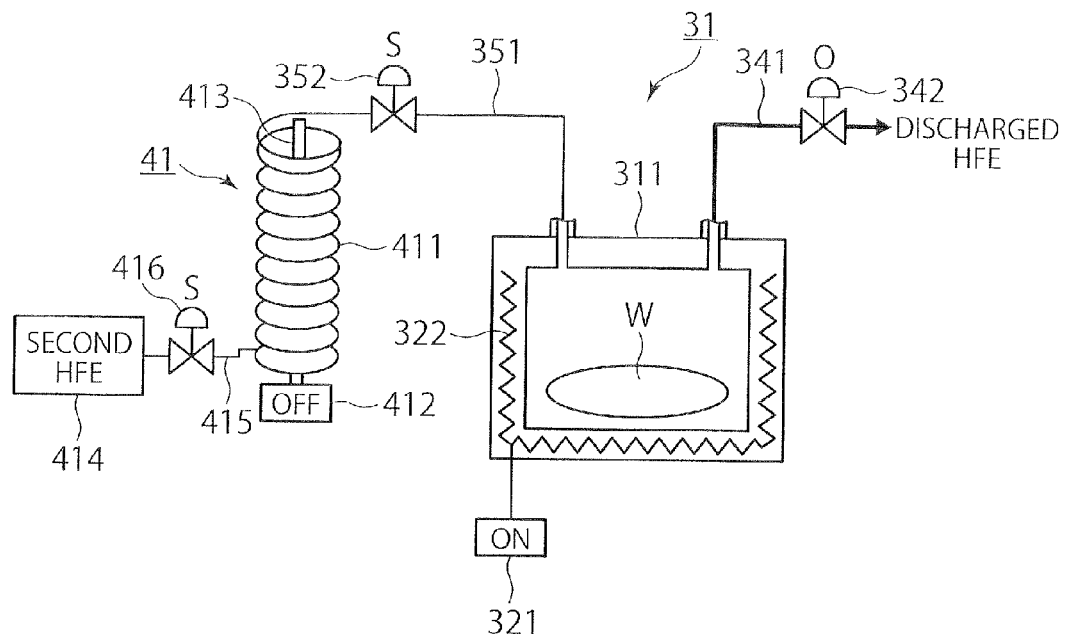
FIG. 10 is a fifth explanatory diagram illustrating the action of the supercritical processing unit.
Figure 14:
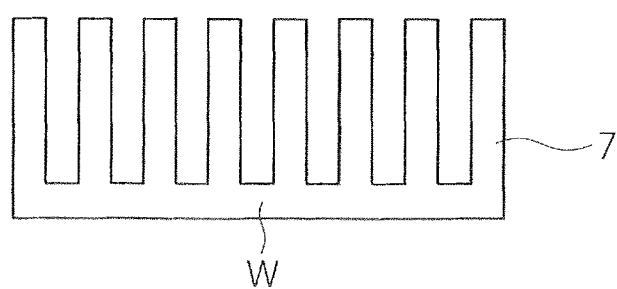
FIG. 14 is a fourth explanatory diagram illustrating the state of the wafer being processed.

After the elapse of a period of time that is necessary to remove the liquid 61 of the first fluorine-containing organic solvent from the surface of the wafer W, the on-off valve 342 of the discharge line 341 is opened as shown in FIG. 10 to discharge the fluorine-containing organic solvents from the processing container 31. During the discharge of the fluid, the amount of heat supplied from the heater 322 is controlled so that the interior of the processing chamber 31 is kept e.g. at a temperature above the critical temperature of the second fluorine-containing organic solvent. The first fluorine-containing organic solvent, whose boiling point is lower than the critical temperature of the second fluorine-containing organic solvent, will not liquefy at such a temperature, and the mixed fluid can be discharged in a supercritical state of a gaseous state. This can avoid the occurrence of pattern collapse upon discharge of the fluid (FIG. 14).

Upon the completion of processing with the supercritical fluid, the wafer W which has been dried by removal of the liquid is taken by the second transport mechanism 161 out of the processing chamber 31, transported along the opposite route to that along which it has previously been transported, and placed in the FOUP 100. The sequence of operations for the wafer W is thus completed. The wafers W in the FOUP 100 are successively subjected to the above-described processing in the liquid processing apparatus 1.

The liquid processing apparatus 1 of this embodiment has the following advantageous effects: A wafer W is transported from one of the liquid processing units 2 to one of the supercritical units 3 while the surface of the wafer W is covered with the first fluorine-containing organic solvent having a higher boiling point (lower vapor pressure) than that of the second fluorine-containing organic solvent for use as a material for a supercritical fluid. This makes it possible to reduce the amount of the fluorine-containing organic solvent that evaporates during transportation of the wafer, compared to the case where the second fluorine-containing organic solvent is used as an anti-drying liquid.

The second fluorine-containing organic solvent, having a lower boiling point than that of the first fluorine-containing organic solvent, has a lower critical temperature than that of the first fluorine-containing organic solvent. Therefore, when using the second fluorine-containing organic solvent as a material for a supercritical fluid, it is possible to perform processing of a wafer with the supercritical fluid at a relatively low temperature at which the fluorine-containing organic solvents hardly decompose. Furthermore, because the critical temperature of the second fluorine-containing organic solvent is higher than the boiling point of the first fluorine-containing organic solvent, the first fluorine-containing organic solvent can be prevented from condensing upon discharge of the fluid from the processing container 31. This can prevent the pattern collapse upon discharge of the fluid.

There are cases where the dew point of the first fluorine-containing organic solvent can be lower than the boiling point e.g. in relation to the vapor pressure of the first fluorine-containing organic solvent in the processing container 31. Thus, it is not essential to select, as the first fluorine-containing organic solvent, one having a boiling point which is lower than the critical point of the second fluorine-containing organic solvent. For example, even when the boiling point of the first fluorine-containing organic solvent is about 10° C. lower than the critical point of the second fluorine-containing organic solvent, the mixture of the fluorine-containing organic solvents can be discharged from the processing container 31 while preventing condensation of the first fluorine-containing organic solvent and thus preventing the pattern collapse.

Though in this embodiment the second fluorine-containing organic solvent, which has previously been turned into a supercritical state, is supplied to a wafer W in the processing container 31, the present invention is not limited to this manner of supplying a supper critical fluid to a wafer. For example, it is possible to store a liquid of the second fluorine-containing organic solvent in the processing container 31, and to immerse a wafer W, which has been transported from the liquid processing unit 2 to the processing container 31 in the liquid of the second fluorine-containing organic solvent and then to raise the internal temperature and pressure of the processing container 31 to obtain a supercritical fluid of the mixture of the first fluorine-containing organic solvent and the second fluorine-containing organic solvent. Alternatively, it is possible to obtain a supercritical fluid of the mixture of the solvents by raising the internal temperature and pressure of the processing container 31 while supplying the second fluorine-containing organic solvent in a gaseous state into the processing container 31 in which a wafer W is housed.

The first and second fluorine-containing organic solvents are, of course, not limited to the specific products shown in Table 1 above and the materials (HFE, HFC and PFC) of the products. By using the first fluorine-containing organic solvent, having a higher boiling point than that of the second fluorine-containing organic solvent, as an anti-drying liquid, the amount of the liquid that evaporates during transportation of a wafer W can be reduced even when the fluorine-containing organic solvent(s) used is HFE, HFC or PFC having a different molecular structure from the products shown in Table 1.

The second fluorine-containing organic solvent needs not necessarily be in a supercritical state, when it is brought into contact with the anti-drying first fluorine-containing organic solvent adhering to a wafer W in order to remove the first solvent. For example, the first fluorine-containing organic solvent may be removed from a wafer W by using the second fluorine-containing organic solvent in a subcritical state.

EXAMPLES (Experiment) An atmosphere of a mixture of an anti-drying liquid and a supercritical fluid was formed in a closed processing container which houses a specimen 70. Thereafter, the surface of the specimen 70 was observed for the occurrence of pattern collapse.

A. Experimental Conditions

Example 1

Figure 15:
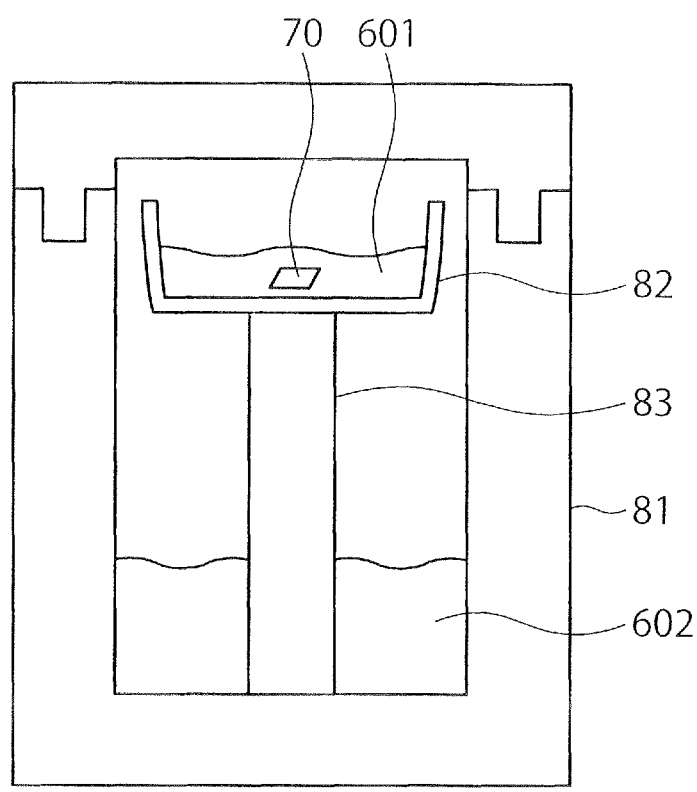
FIG. 15 is a vertical sectional side view of an autoclave used in the Examples.

A material 602 for a supercritical fluid was fed to the bottom of the autoclave 81 (processing container 31) shown in FIG. 15. The specimen 70, having a pattern 7 formed in the surface, was placed on a plate 82 supported by a support member 83, and an anti-drying liquid 601 was supplied to the surface of the specimen 70. 2 cc of AC-6000 was used as the anti-drying liquid 601 (first fluorine-containing organic solvent), and 30 cc FC-72 was used as the material 602 (second fluorine-containing organic solvent). The interior of the hermetically-closed autoclave 81 was heated to raise the internal temperature to 180° C. and the internal pressure to 2 to 3 MPa, and the temperature/pressure conditions were maintained for one hour. Thereafter, while maintaining the internal temperature, the autoclave 81 was depressurized by gradually discharging the fluid from the autoclave 81. Thereafter, the specimen 70 was taken out of the autoclave 81, and was observed under a microscope to check the occurrence of pattern collapse.

Comparative Example 1

The specimen 70, whose surface was covered with 3 cc of IPA (boiling point 82° C., critical temperature 235° C.) as an anti-drying liquid 601, was set in the processing container 31 having a volume of 100 cc. $CO_2$ in a high-pressure state (critical temperature 31° C., 7.4 MPa (abs. pressure)) was supplied into the processing chamber 31 to raise the internal temperature to 150° C. and the internal pressure to 8.5 MPa, and the temperature/pressure conditions were maintained. Thereafter, while keeping the internal temperature above the boiling point of IPA, the processing container 31 was depressurized by gradually discharging the fluid from the processing container 31. Thereafter, the specimen 70 was taken out of the processing container 31, and was observed under a microscope to observed the occurrence of pattern collapse.

B. Experimental Results

Example 1

As a result of observation of the specimen 70 of Example 1, pattern collapse was found only at a few sites in the surface. This verifies that the anti-drying liquid 601 can be removed from the surface of the specimen 70 while preventing the occurrence of pattern collapse even when using the closed system to which no fresh supercritical fluid is supplied from the outside.

Comparative Example 1

As a result of observation of the specimen 70 of Comp. Example 1, pattern collapse was found at many sites in the surface. In the system using IPA as the anti-drying liquid 601 and $CO_2$ as the supercritical fluid, the boiling point (82° C.) of IPA is considerably higher than the critical temperature (31° C.) of $CO_2$. Accordingly, as is known in the art, if liquid IPA is dissolved in supercritical $CO_2$ in the hermetically-closed processing container 31, the IPA will liquefy upon discharge of the fluid from the processing container 31, causing pattern collapse. Therefore, when the IPA is removed using supercritical $CO_2$, the following method is employed. The method comprises withdrawing supercritical $CO_2$, containing dissolved IPA, from the processing container 31 while continuously supplying supercritical $CO_2$ into the processing container 31 and, when the IPA concentration in the processing container 31 has decreased sufficiently, stopping the supply of supercritical $CO_2$ to depressurize the processing container 31. According to this method, a wafer W can be dried without causing pattern collapse.

What is claimed is:

1. A substrate processing method for removing a fluorine-containing organic solvent, which has been supplied to a surface of a substrate, having a pattern formed in the surface, after processing of the substrate with a liquid and which covers the surface of the substrate, from the surface of the substrate by bringing the solvent into contact with a high-pressure fluid, said method comprising the steps of:
  carrying the substrate to a processing container, the surface of the substrate being covered with a first fluorine-containing organic solvent, the first fluorine-containing organic solvent having a first boiling point, the first boiling point being one of 165° C. or 174° C., and evaporating, while the substrate is being carried to the processing container, only an amount of the first fluorine-containing organic solvent from the substrate, the amount maintaining, for a selected amount of time, while the substrate is being carried to the processing container, the surface of the substrate wet with the first fluorine-containing organic solvent, the selected amount of time being based on a selected volume of the first fluorine-containing organic solvent necessary to cover the surface of the substrate, the size of the substrate, and the first boiling point;

forming a high-pressure fluid atmosphere of a mixture of the first fluorine-containing organic solvent and a second fluorine-containing organic solvent, the second fluorine-containing organic solvent having a second boiling point, the second boiling point being lower than the first boiling point of the first fluorine-containing organic solvent, and a critical temperature, the critical temperature of the second fluorine-containing organic solvent being higher than the first boiling point of the first fluorine-containing organic solvent, and forming a supercritical fluid at a critical temperature which prevents release of fluorine atoms due to decomposition of the first and second fluorine-containing organic solvents, in the processing container;

supplying a high-pressure fluid of the second fluorine-containing organic solvent into the processing container, or by supplying a gas or liquid of the second fluorine-containing organic solvent into the processing container and then heating the gas or liquid to a temperature not less than the critical temperature of the second fluorine-containing organic solvent to turn the gas or liquid into a high-pressure fluid; and then discharging a fluid in the state of a high-pressure fluid or a gas from the processing container.

2. The substrate processing method according to claim 1, wherein the high-pressure fluid atmosphere of the mixture is formed in the processing container when stopping the supply of the second fluorine-containing organic solvent.

3. The substrate processing method according to claim 1, wherein the critical temperature of the second fluorine-containing organic solvent is not more than 200° C.

4. The substrate processing method according to claim 1, wherein a mol-based mixing ratio of the first fluorine-containing organic solvent to the second fluorine-containing organic solvent is not more than 1/10.

5. The substrate processing method according to claim 1, wherein an internal temperature of the processing container in the step of forming a high-pressure fluid atmosphere of the mixture is so determined as to make the content of fluorine, generated by decomposition of the fluorine-containing organic solvents of the mixture, in the fluid discharged from the processing container not more than 100 weight ppm.

6. A non-transitory storage medium storing a computer program for use in a substrate processing apparatus for removing a fluorine-containing organic solvent, which has been supplied to a surface of a substrate having a pattern formed in the surface, by bringing the solvent into contact with a high-pressure fluid, wherein said program contains steps to perform the substrate processing method according to claim 1.

7. A substrate processing method for removing a fluorine-containing organic solvent, which has been supplied to a surface of a substrate, having a pattern formed in the surface, after processing of the substrate with a liquid and which covers the surface of the substrate, from the surface of the substrate by bringing the solvent into contact with a high-pressure fluid, said method comprising the steps of:

carrying the substrate to a processing container, the surface of the substrate being covered with a first fluorine-containing organic solvent, the first fluorine-containing organic solvent having a first boiling point, the first fluorine-containing organic solvent being PFC, and evaporating, while the substrate is being carried to the processing container, only an amount of the first fluorine-containing organic solvent from the substrate, the amount maintaining, for a selected amount of time, while the substrate is being carried to the processing container, the surface of the substrate wet with the first fluorine-containing organic solvent, the selected amount of time being based on a selected volume of the first fluorine-containing organic solvent necessary to cover the surface of the substrate, the size of the substrate, and the first boiling point;

forming a high-pressure fluid atmosphere of a mixture of the first fluorine-containing organic solvent and a second fluorine-containing organic solvent, the second fluorine-containing organic solvent having a second boiling point the second boiling point being lower than the first boiling point of the first fluorine-containing organic solvent, and a critical temperature, the critical temperature of the second fluorine-containing organic solvent being higher than the first boiling point of the first fluorine-containing organic solvent, and forming a supercritical fluid at a critical temperature which prevents release of fluorine atoms due to decomposition of the first and second fluorine-containing organic solvents, in the processing container;

supplying a high-pressure fluid of the second fluorine-containing organic solvent into the processing container, or by supplying a gas or liquid of the second fluorine-containing organic solvent into the processing container and then heating the gas or liquid to a temperature not less than the critical temperature of the second fluorine-containing organic solvent to turn the gas or liquid into a high-pressure fluid; and then discharging a fluid in the state of a high-pressure fluid or a gas from the processing container.

* * * * *